(12) United States Patent
Kohno

(10) Patent No.: US 6,999,157 B2
(45) Date of Patent: Feb. 14, 2006

(54) ILLUMINATION OPTICAL SYSTEM AND METHOD, AND EXPOSURE APPARATUS

(75) Inventor: Michio Kohno, Tochigi (JP)

(73) Assignee: Canon Kabushiki Kaisha, Tokyo (JP)

( * ) Notice: Subject to any disclaimer, the term of this patent is extended or adjusted under 35 U.S.C. 154(b) by 176 days.

(21) Appl. No.: 10/421,271

(22) Filed: Apr. 23, 2003

(65) Prior Publication Data
US 2003/0197838 A1 Oct. 23, 2003

(30) Foreign Application Priority Data
Apr. 23, 2002 (JP) ............................. 2002-121506

(51) Int. Cl.
G03G 27/42 (2006.01)
G03B 27/54 (2006.01)
G03B 27/32 (2006.01)
G03C 5/00 (2006.01)

(52) U.S. Cl. ............................. 355/53; 355/67; 355/77; 430/311

(58) Field of Classification Search ................... 355/53, 355/67, 71, 77; 430/5, 311, 312
See application file for complete search history.

(56) References Cited

U.S. PATENT DOCUMENTS

| | | | | |
|---|---|---|---|---|
| 5,345,292 A | | 9/1994 | Shiozawa et al. ............ 355/67 |
| 5,357,311 A | * | 10/1994 | Shiraishi ...................... 355/53 |
| 5,357,312 A | | 10/1994 | Tounai ........................ 355/67 |
| 5,452,054 A | | 9/1995 | Dewa et al. .................. 355/67 |
| 5,675,401 A | | 10/1997 | Wangler et al. .............. 355/67 |
| 5,719,704 A | * | 2/1998 | Shiraishi et al. ............. 359/558 |
| 6,211,944 B1 | | 4/2001 | Shiraishi ...................... 355/53 |
| 6,233,041 B1 | | 5/2001 | Shiraishi ...................... 355/53 |
| 6,252,647 B1 | | 6/2001 | Shiraishi ...................... 355/53 |
| 6,259,512 B1 | | 7/2001 | Mizouchi ..................... 355/67 |
| 6,355,382 B1 | * | 3/2002 | Yasuzato et al. .............. 430/5 |

FOREIGN PATENT DOCUMENTS

| | | |
|---|---|---|
| JP | A2003-234285 | 8/2003 |
| JP | A2003-318086 | 11/2003 |
| JP | A2004-063988 | 2/2004 |
| JP | A2004-071776 | 3/2004 |

* cited by examiner

Primary Examiner—Alan Mathews
(74) Attorney, Agent, or Firm—Morgan & Finnegan, L.L.P.

(57) ABSTRACT

An illumination optical system for illuminating a reticle using light from a light source includes an illumination-light generating mechanism for generating a light amount distribution on a plane that has a substantially Fourier conversion relationship with the reticle while making variable a ratio of a light amount or area between a first area and a second area different from the first area, the first and second areas being on the plane, wherein light from the first area illuminates the reticle to resolve a desired pattern on the reticle, and light from the second area illuminates the reticle to restrain an auxiliary pattern on the reticle from resolving.

16 Claims, 17 Drawing Sheets 244a    244b

300a

RESOLUTION PATTERN    EFFECTIVE LIGHT SOURCE SHAPE

ILLUMINATION OPTICAL SYSTEM AND METHOD, AND EXPOSURE APPARATUS

This application claims the right of priority under 35 U.S.C. §119 based on Japanese Patent Application No. 2002-121506, filed on Apr. 23, 2002, which is hereby incorporated by reference herein in its entirety as if fully set forth herein.

BACKGROUND OF THE INVENTION

The present invention relates generally to illumination optical systems, and more particularly to an illumination optical system apparatus used to expose devices such as single crystal plates for semiconductor wafers, glass plates for liquid crystal displays (LCD), and the like. The present invention is suitable, for example, for an illumination optical system that projects and exposes an object that includes a contact-hole line pattern or a mixture of isolated contact hole and contact-hole line in a photolithography process.

Along with recent demands on smaller and thinner profile electronic devices, fine semiconductor devices to be mounted onto these electronic devices have been increasingly demanded. For example, a design rule has attempted to form a circuit pattern of 100 nm or less on a mass production line, and which will expectedly shift to 80 nm or less. The mainstream photolithography technology has conventionally used a projection exposure apparatus that projects and transfers a pattern on a mask (a reticle) onto a wafer.

Rayleigh equation provides the resolution R of the projection exposure apparatus using a light-source wavelength $\lambda$ and a numerical aperture (NA) of the projection optical system as follows:

$$R = k_1 \times \frac{\lambda}{NA} \quad (1)$$

A focus range that may maintain certain imaging performance is called a depth of focus (DOF), which is defined in the following equation:

$$DOF = k_2 \times \frac{\lambda}{NA^2} \quad (2)$$

Since small DOF makes focusing difficult and thus requires strict flatness and focus accuracy, larger DOF is preferable.

A mask pattern includes an adjacent and periodic line and space (L & S) pattern, an adjacent and periodic contact-hole line that arranges holes at an approximately hole interval, an isolated contact hole that does not have a pair and thus is isolated, other isolated patterns, etc. A pattern transfer with high resolution requires a selection of optimal illumination condition in accordance with pattern types.

The recent semiconductor industry has shifted its production to a highly value-added system chip that mixes a wide variety of patterns. However, the prior art cannot finish exposure such a contact-hole pattern at one time with high resolution, as blends a contact-hole line and an isolated contact hole.

Various methods have been proposed to increase DOF by improving the resolution limit only for a contact-hole line and a longitudinally and laterally periodic wire pattern. These methods include, for example, a double exposure or multi-exposure method that uses two masks to separately expose different types of patterns, an exposure method that uses one mask and special illumination conditions, and a method that provides a mask with various auxiliary patterns to improve the resolving power for a desired pattern.

The above methods commonly require an illumination optical system that serves to freely vary illumination conditions, specifically an effective light-source distribution of the illumination optical system, whenever a size and arrangement of a mask pattern changes according to processes. Disadvantageously, the conventional illumination optical system cannot provide this function, or obtain a high resolution with an optimal illumination condition.

Prior art discloses a switch mechanism from a normal circle effective light source to an annular effective light source, and a switch mechanism to a quadrupole effective light source. However, a change of an effective light source is necessary even in the same type to improve the resolution for future fine patterns and wide variety of patterns.

BRIEF SUMMARY OF THE INVENTION

Accordingly, it is an exemplified object of the present invention to provide an illumination optical system that obtains a desired effective light source according to changes of a pattern, and partially changes the effective light source.

An illumination optical system of one aspect of the present invention for illuminating a reticle using light from a light source includes an illumination-light generating mechanism for relatively displacing a first area and a second area different from the first area, the first and second areas being a light amount distribution formed on a plane that has a substantially Fourier conversion relationship with the reticle, wherein light from the first area illuminates the reticle to resolve a desired pattern on the reticle, and light form the second area illuminates the reticle to restrain an auxiliary pattern on the reticle from resolving.

At least one of the first and second areas may have plural areas that are movable, for example, symmetrically, relative to an optical axis. The effective light-source generating mechanism may be a light deflection member including a prism or diffraction optical element.

An illumination optical system of another aspect of the present invention for illuminating a reticle using light from a light source includes a first member for forming a first area in a light amount distribution on a plane that has a substantially Fourier conversion relationship with the reticle, a second member for forming a second area different from the first area on the plane, and a drive mechanism for relatively displacing the first and second areas by moving at least one of the first and second members in an optical-axis direction, wherein light from the first area illuminates the reticle to resolve a desired pattern on the reticle, and light from the second area illuminates the reticle to restrain an auxiliary pattern on the reticle from resolving.

At least one of the first and second areas may have plural areas movable, for example, symmetrically, movable relative to an optical axis. The first and second members may be respectively a light deflection member including a prism.

An exposure method of another aspect of the present invention includes the step of illuminating a reticle using the above illumination optical system with light from a light source, wherein light from the first area illuminates the reticle to resolve a desired pattern on the reticle, and light from the second area illuminates the reticle to restrain an auxiliary pattern on the reticle from resolving.

An illumination method for illuminating a reticle having a pattern using light from a light source includes the illumination method comprising the steps of obtaining information of the pattern, and displacing first and second effective light-source areas relative to each other based on the information of the pattern obtained in the obtaining step, the first effective light-source area being for resolving the pattern, and the second effective light-source area being different from the first effective light-source area, wherein the pattern includes a desired pattern and an auxiliary pattern. Light from the first area may substantially resolve the desired pattern, and light from the second area may restrain the auxiliary pattern from resolving.

An illumination optical system of another aspect of the present invention for illuminating a reticle using light from a light source includes a prism for generating a light amount distribution on a plane that has a substantially Fourier conversion relationship with the reticle, wherein the prism includes plural members aligned in a direction perpendicular to an optical axis, and at least one of the plural members may vary a position relative to the other plural members in an optical-axis direction.

An exposure method for illuminating a reticle and exposing an object using light from the reticle includes the steps of obtaining information of a pattern formed on the reticle, and displacing first and second effective light-source areas relative to each other based on the information of the pattern obtained in the obtaining step, the first effective light-source area being for resolving the pattern, and the second effective light-source area being different from the first effective light-source area, wherein the pattern includes a desired pattern and an auxiliary pattern.

An exposure apparatus of another aspect of the present invention includes the above illumination optical system, and a projection optical system for projecting light through the reticle onto an object to be exposed.

A device fabricating method of still another aspect of the present invention includes the steps of exposing an object using the above exposure apparatus, and performing a predetermined process for the exposed object. Claims for a device fabricating method that performs operations similar to that of the above exposure apparatus cover devices as intermediate and final products. Such devices include semiconductor chips like an LSI and VLSI, CCDs, LCDs, magnetic sensors, thin film magnetic heads, and the like.

Other objects and further features of the present invention will become readily apparent from the following description of the preferred embodiments with reference to accompanying drawings.

DETAILED DESCRIPTION OF THE PREFERRED EMBODIMENTS

Figure 1:
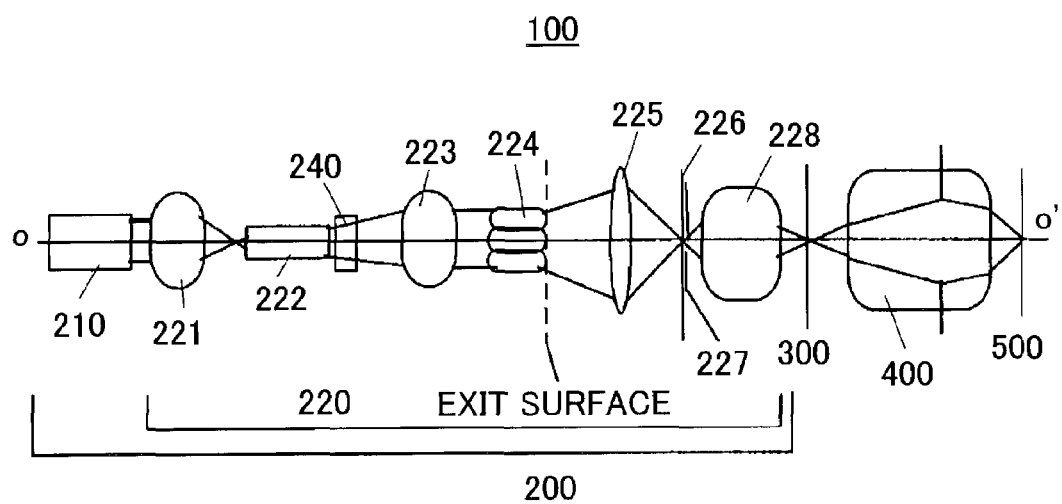
FIG. 1 is a schematic sectional view of an exposure apparatus of one embodiment according to the present invention.

Referring now to the accompanying drawings, a description will be now given of an exposure apparatus 1 according to the present invention. The present invention is not limited to these embodiments and each element is replaceable within a scope that achieves the objects of the present invention. The same element in each figure is designated by the same reference numeral, and a description will be omitted.

FIG. 1 is a schematic structural view of an exposure apparatus 100 of one embodiment according to the present invention. As best shown in FIG. 1, the exposure apparatus 100 includes an illumination apparatus 200, a mask 300, a projection optical system 400, and a plate 500.

The exposure apparatus 100 is a projection exposure apparatus that exposes onto the plate 500 a circuit pattern created on the mask 300, for example, in a step-and-repeat or step-and-scan manner. This projection exposure apparatus is suitable for a lithography process of a submicron, quarter-micron or less, and thus a description will be given of a step-and-scan type exposure apparatus (also called as a "scanner") as an example in this embodiment. Here, the "step-and-repeat manner" is one mode of exposure method that moves a wafer stepwise to an exposure area for the next shot every shot of cell projection onto the wafer. The "step-and-scan manner," is another mode of exposure method that exposes a mask pattern onto a wafer by continuously scanning the wafer relative to the mask, and by moving, after a shot of exposure, the wafer stepwise to the next exposure area to be shot.

The illumination apparatus 200 illuminates the mask 300 that forms a circuit pattern to be transferred, and includes a light source section 210 and an illumination optical system 220.

The light source section 210 employs, for example, laser as a light source. Laser may use ArF excimer laser with a wavelength of approximately 193 nm, KrF excimer laser with a wavelength of approximately 248 nm, $F_2$ excimer laser with a wavelength of approximately 157 nm, etc. A type of laser is not limited to excimer laser, and the number of laser units is not limited. The light source section 210 may use extreme ultra violet ("EUV") light with a laser plasma light source. A light source applicable to the light source section 210 is not limited to the laser, but may use one or more lamps such as a mercury lamp, xenon lamp, etc.

The illumination optical system 220 is an optical system that uses light from the light source 210 to illuminates the mask 300 as an object surface, which forms a desired pattern. The illumination optical system 220 includes a beam shaping optical system 221, a uniformization element 222, a first zoom condenser lens 223, an integrator 224, a second zoom condenser lens 225, a slit 226, a masking blade 227, and a masking imaging system 228 in the instant embodiment.

The illumination light emitted from the light source 210 enters the uniformization element 222 after focusing once under the influence of the beam shaping system 221. The uniformization element 222 serves to convert a beam on a plane perpendicular to an optical axis into an approximately uniform distribution.

The illumination light emitted from the uniformization element 222 passes the effective light-source generating means 240 and first zoom condenser lens 223, and enters the integrator 224. In the instant embodiment, the light intensity distribution formed on the exit surface of the integrator 224 determines an effective light-source distribution, and contributes to the imaging performance of the exposure apparatus 100.

The illumination light emitted from the integrator 224 condenses on the slit 226 surface under the influence of the second condenser lens 225, and is cut out by a slit shape under the light-shielding effect of the slit 226, which slit shape is part corresponding to an aberration correction area in the projection optical system 400. The transmission light passes the masking blade 227 that is located just after the slit 226 and forms an image on the mask 300 at a predetermined magnification due to the imaging operation of the masking imaging system 228.

Figure 2:
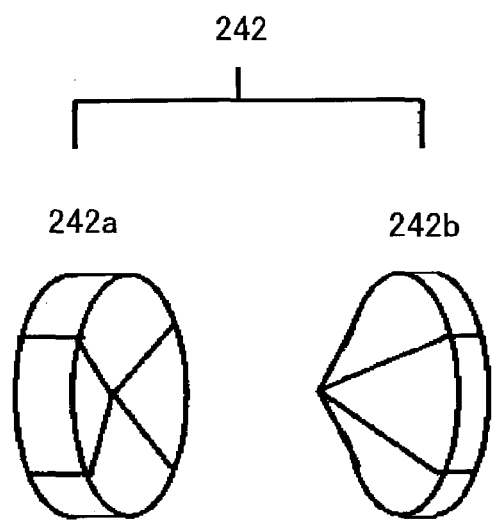
FIG. 2 is a schematic view of a quadrupole prism as an example of a modified-illumination generating element.
Figure 3:
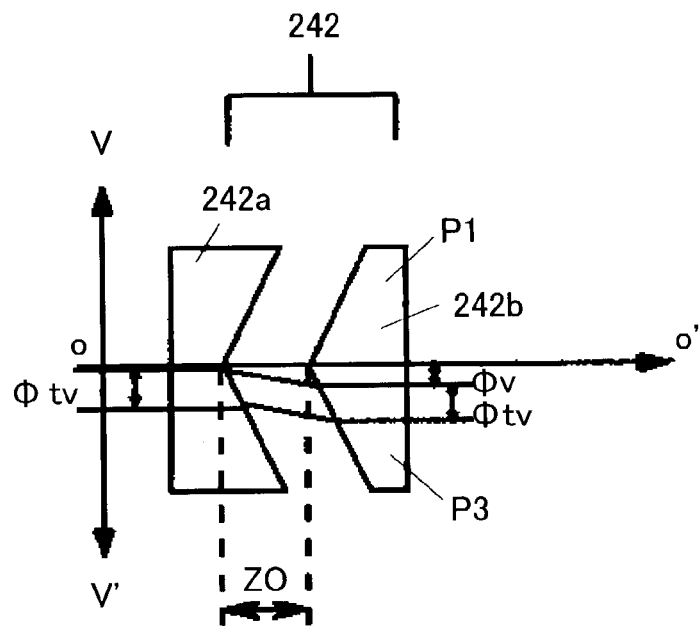
FIG. 3 is a schematic sectional view of a quadrupole prism shown in FIG. 2 in an optical-axis direction.
Figure 4:
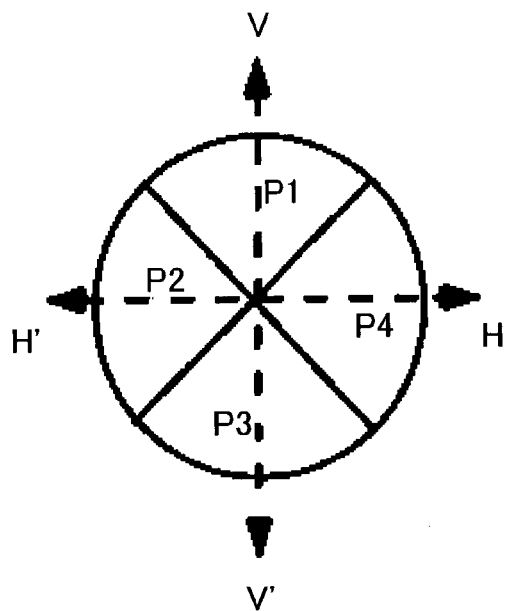
FIG. 4 is a schematic sectional view of a quadrupole prism shown in FIG. 2 in a direction perpendicular to the optical-axis direction.

A detailed description will be given of the illumination-light generating means 240. The effective light-source forming means 240 includes a modified-illumination generating means 242 as a transmission member. The modified-illumination generating means 242 includes, for example, a quadrupole prism 242 shown in FIG. 2. The quadrupole prism 242 includes a concave prism 242a and a convex prism 242b in view of a section in the optical-axis direction shown in FIG. 3. As shown in FIG. 4, the concave and convex prisms 242a and 242b include four regularly segmented areas P1, P2, P3 and P4 at an angular interval of 90° around the optical axis. Here, FIG. 2 is a schematic view of the quadrupole prism 242 as an example of a modified-illumination generating element. FIG. 3 is a schematic sectional view of the quadrupole prism 242 in the optical-axis direction. FIG. 4 is a schematic sectional view the quadrupole prism 242 in a direction perpendicular to the optical-axis direction.

Figure 5:
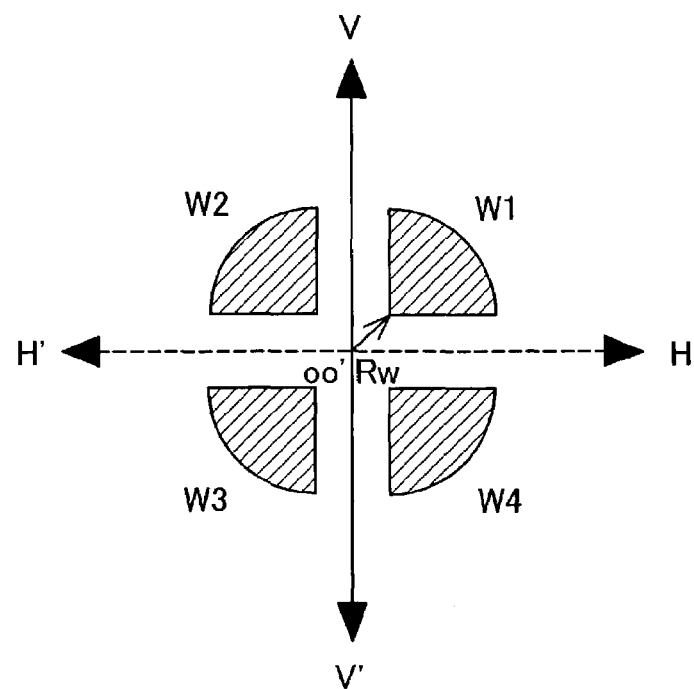
FIG. 5 is a schematic view of an exemplary effective light-source distribution that the quadrupole prism shown in FIG. 2 forms.
Figure 6:
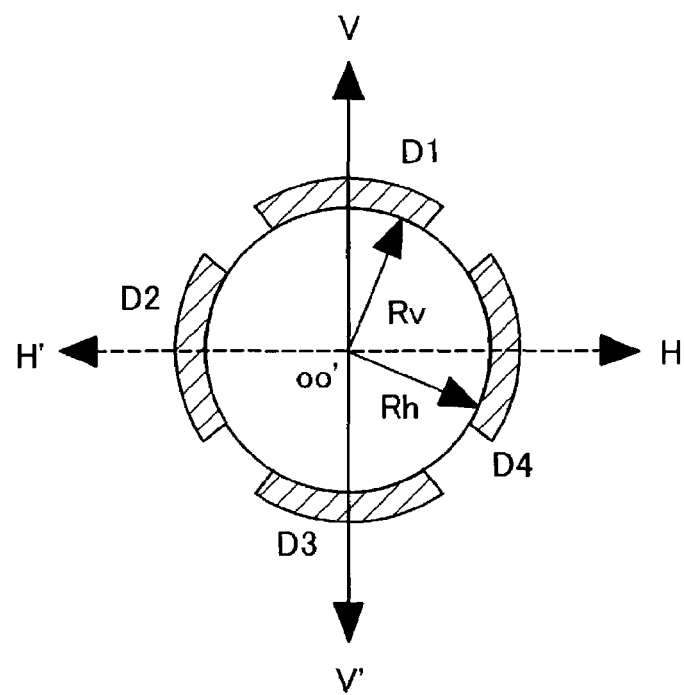
FIG. 6 is a schematic view of an exemplary effective light-source distribution that the quadrupole prism shown in FIG. 2 forms.

The quadrupole prism 242 forms an effective light-source distribution shown in FIGS. 5 and 6. FIGS. 5 and 6 are schematic views of exemplary effective light-source distributions that the quadrupole prism 242 in FIG. 2 forms. As shown in FIGS. 5 and 6, areas W1, W2, W3, W4, D1, D2, D3 and D4 (i.e., diagonal parts) are bright parts and distances Rw, Rv and Rh from the optical axis O–O' are determined by an interval zo between the concave and convex prisms 242a and 242b shown in FIG. 3 and zooming magnification of the first zoom condenser 223.

Figure 7:
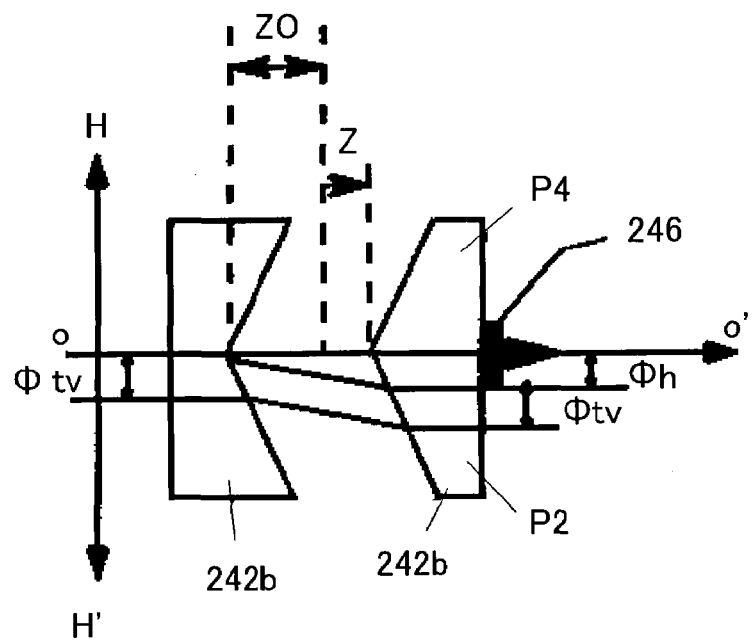
FIG. 7 is a schematic sectional view of concave and convex prisms shown in FIG. 3 rotated around an optical axis by 90°.

A description will be given of characteristics of the present invention. FIG. 7 is a schematic sectional view, i.e., on a section H–H', of concave and convex prisms 242a and 242b shown in FIG. 3 rotated around the optical axis by 90°. The areas P2 and P4 appear on the section H–H' among four divided areas, and offset, by a distance z in the optical-axis direction, ahead of the areas P1 and P3 on the concave and convex prisms 242a and 242b shown in FIG. 3. A partial zooming means or drive means 246 works well for this configuration.

Figure 8:
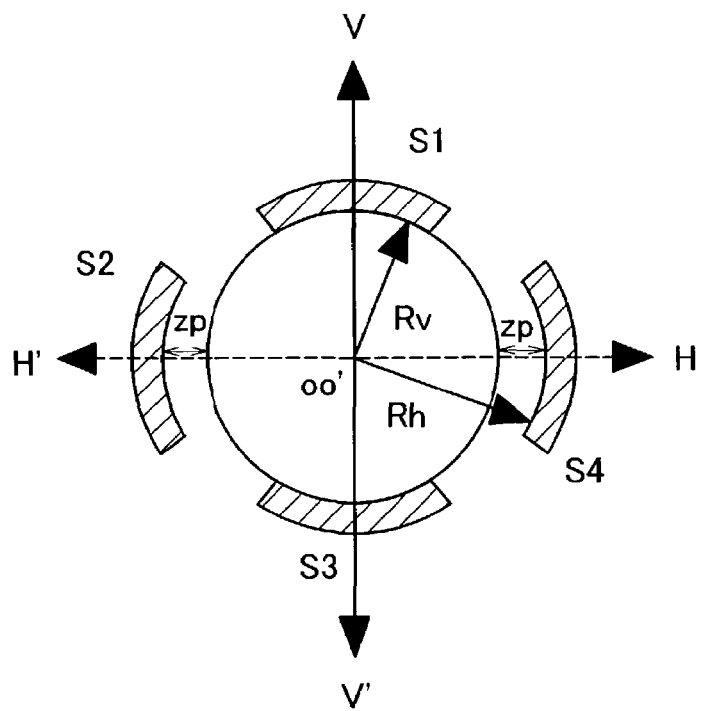
FIG. 8 is a schematic view of an exemplary effective light-source distribution that the quadrupole prism shown in FIGS. 3 and 7 form.

This configuration forms the effective light-source distribution shown in FIG. 8. FIG. 8 is a schematic view of an effective light-source distribution that the quadrupole prism shown in FIGS. 3 and 7 form. Due to the partial zooming effect, bright parts S2 and S4 formed by the areas P2 and P4 are distant from the optical axis O–O' by a distance zp. The radius (distance from the optical axis O–O') Rv of partial effective light sources S1 and S3 is larger than the radius (distance from the optical axis O–O') Rh of the partial effective light sources S2 and S4. An actual circuit pattern includes longitudinally and laterally repetitive wiring. The partial effective light sources S1 and S3 contribute to resolution of a transverse wiring pattern, while the partial effective light sources S2 and S4 determine the resolution of the longitudinal wiring pattern. Thus, the instant partial zooming may provide an optimal illumination condition to longitudinal and lateral wiring patterns even when the same mask includes both of these patterns.

Figure 9:
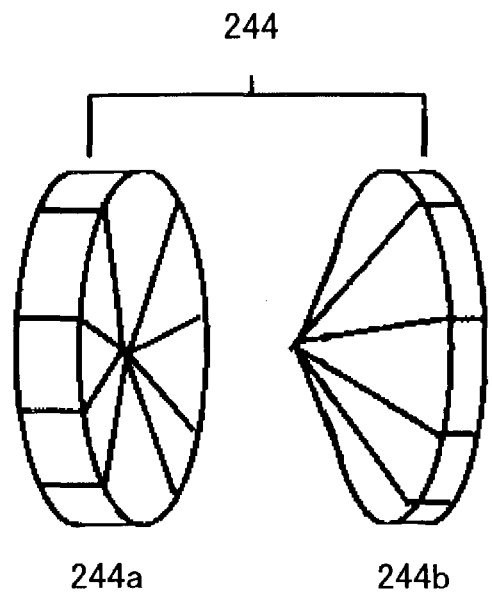
FIG. 9 is a schematic perspective view of an octpole prism as an example of a modified-illumination generating element.
Figure 10:
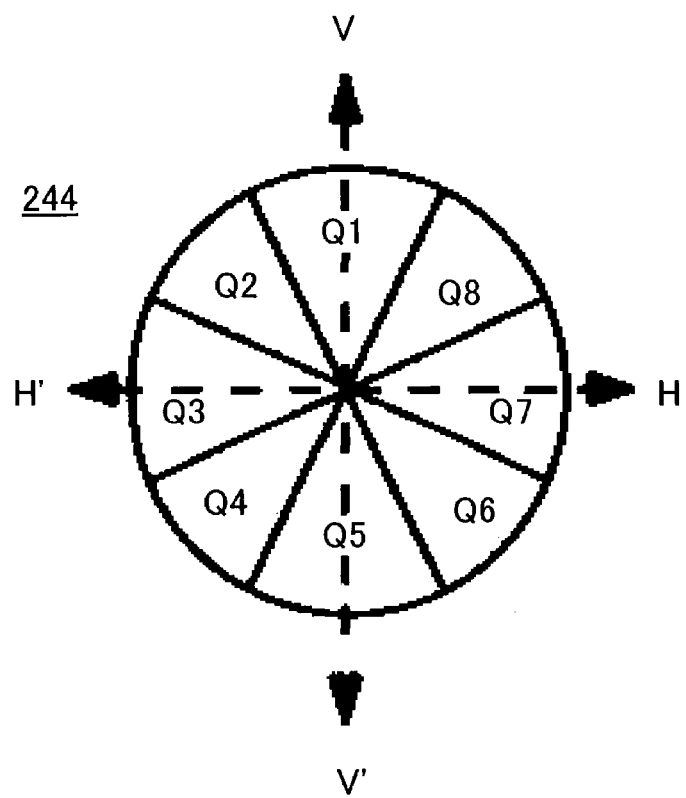
FIG. 10 is a schematic sectional view of an octpole prism shown in FIG. 9 in a direction perpendicular to the optical-axis direction.

A description will be given of a first variation with reference to FIGS. 9 to 13. The modified-illumination generating means 242 uses an octpole prism 244 in this first variation. The octpole prism 244 includes a concave prism 244a and convex prism 244b. As shown in FIG. 10, the concave and convex prism 244a and 244b include eight areas Q1, Q2, Q3, Q4, Q5, Q6, Q7 and Q8 divided at an angular interval of 45° on a section perpendicular to the optical axis. Here, FIG. 9 is a schematic perspective view of the octpole prism 244 as an example of a modified-illumination generating element. FIG. 10 is a schematic sectional view of the octpole prism 244 shown in FIG. 9 in a direction perpendicular to the optical axis.

Figure 11:
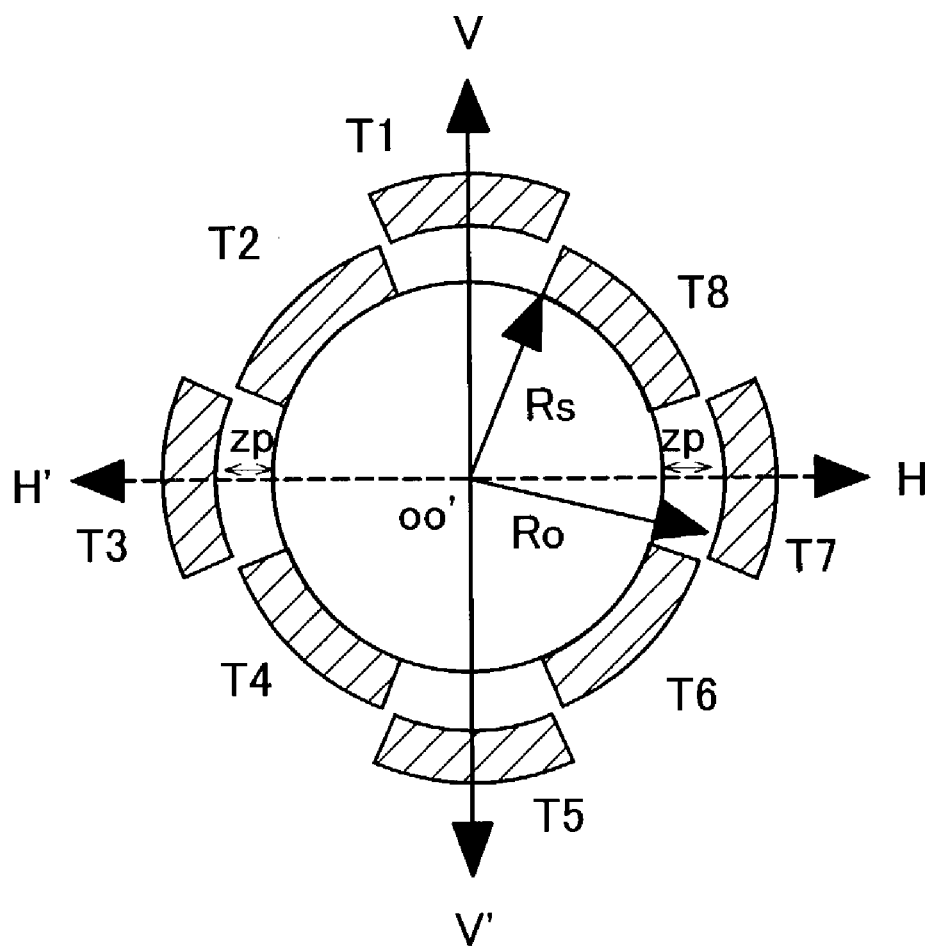
FIG. 11 is a schematic view of an exemplary effective light-source distribution that the octpole prism shown in FIG. 9 forms.

The octpole prism 244 forms an effective light-source distribution shown in FIG. 11. FIG. 11 is a schematic view of an exemplary effective light-source distribution that the octpole prism 244 shown in FIG. 9 forms. Referring to FIG. 11, areas T1, T2, T3, T4, T5, T6, T7 and T8 (i.e., diagonal parts) are partial effective light sources or bright parts.

As discussed, the partial effective light sources T1, T3, T5 and T7 are decentered by a distance zp, and a radius from the optical axis O–O' extends from Rs to Ro, by partially zooming the areas Q1, Q3, Q5 and Q7 among eight divided areas Q1, Q2, Q3, Q4, Q5, Q6, Q7 and Q8 on the octpole prism 244.

Figure 18:
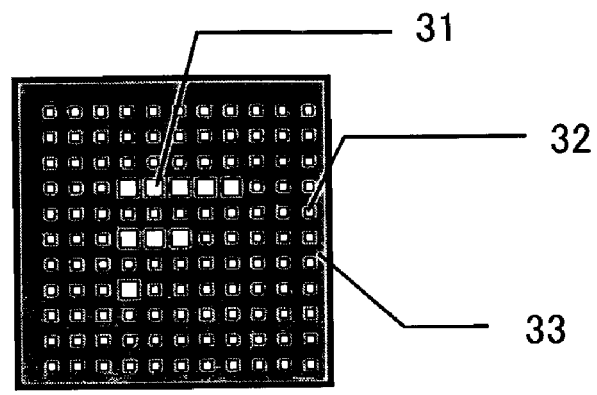
FIG. 18 is a schematic view of a mask used for a second variation.

A description will be given of a second variation. The second variation uses for the mask 300 a mask 300a shown in FIG. 18 that arranges an auxiliary or dummy pattern around a desired contact-hole pattern. Here, FIG. 18 is a schematic view of a binary mask that forms the desired contact-hole pattern and the auxiliary pattern. The mask in FIG. 18 has the desired contact-hole pattern 31 and auxiliary pattern 32 as light transmitting parts, and a light shielding part 33, where each light transmitting part has the same phase. The contact-hole pattern 31 and auxiliary pattern 32 form two-dimensional contact-hole lines that are lined up with a pitch Po=2P in the longitudinal and lateral directions where a hole diameter is P.

The desired contact-hole pattern may be exposed on the plate 500 with good resolving power by illuminating the mask 300a with crossed oblique incidence illumination for resolving the contact hole and other illumination for restraining a dummy resolution caused by the crossed oblique incidence illumination i.e., preventing the exposure dose corresponding to the dummy resolution pattern (with small exposure dose) and enhancing the exposure dose of the desired contact-hole pattern (with large exposure dose). A detailed description will be given of the illumination.

Figure 19:
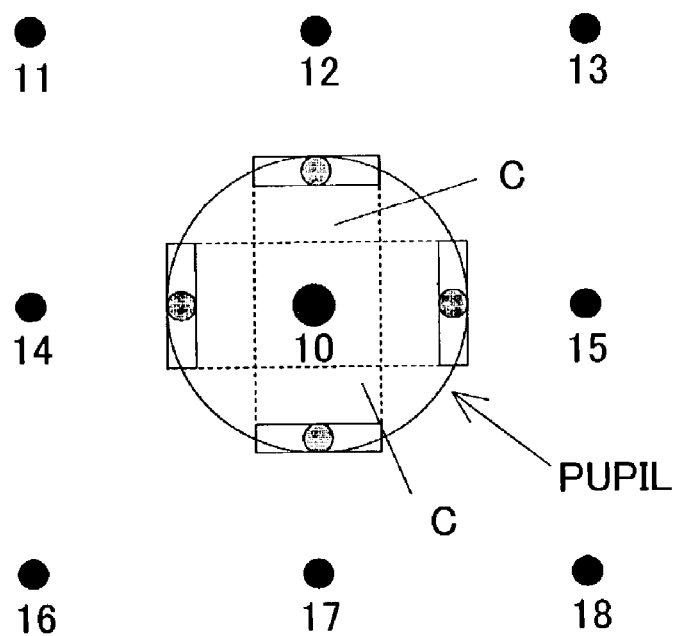
FIG. 19 is a typical view showing positions of diffracted beams on a pupil plane for small σ illumination onto the binary mask shown in FIG. 18 and, positions to which the diffracted beams have moved for oblique incidence illumination.

In case of small σ illumination using the mask 300a in FIG. 18, a diffracted beam, except the 0-th order diffracted beam, deviates from the pupil plane in the projection optical system 400 when a pitch between contact holes is small. As shown in FIG. 19, the 0-th order diffracted beam 10 occurs and diffracted beams of other orders are arranged like diffracted beams 11–18 on the pupil plane. No pattern is formed in this condition. Here, FIG. 19 is a typical view showing positions of diffracted beams on a pupil plane in the projection optical system 400 for small σ illumination onto the mask 300a shown in FIG. 18 and, positions to which diffracted beams move for oblique incidence illumination.

Figure 20:
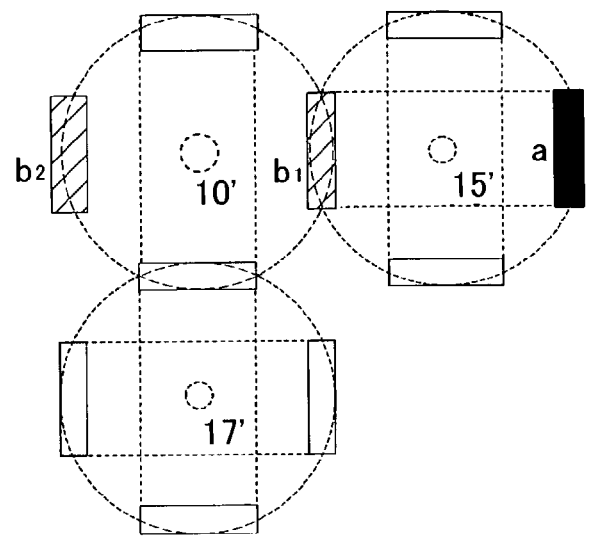
FIG. 20 is a typical view for explaining an effective light-source distribution.
Figure 21:
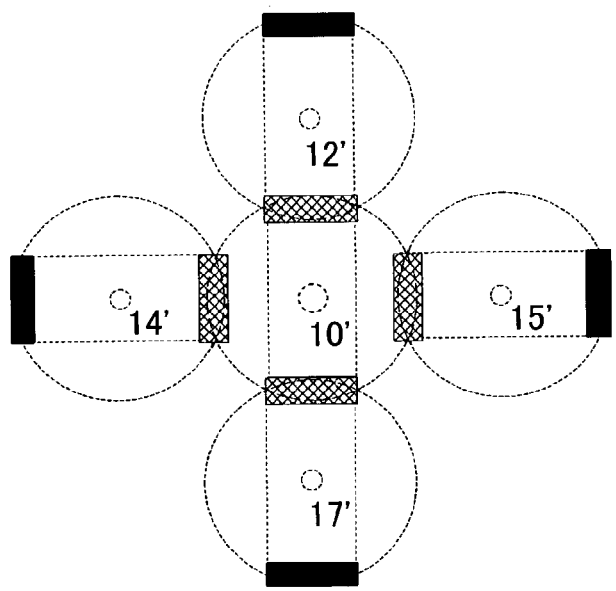
FIG. 21 is a typical view for explaining an effective light-source distribution.
Figure 22A:
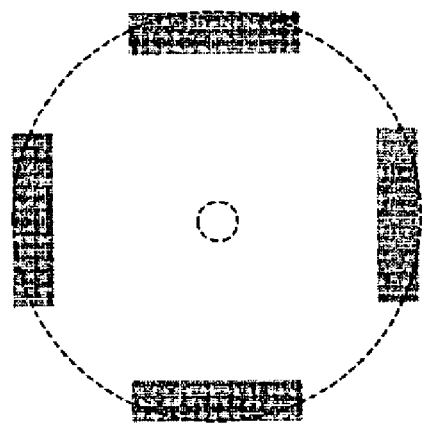
FIG. 22 is a typical view for explaining an effective light-source distribution.

Accordingly, the illumination is required to enable the diffracted beams 11–18 to enter the pupil. For example, in order for two diffracted beams 10 and 15 as an example to enter a diagonal area on the pupil plane in the projection optical system 400 shown in FIG. 19, the oblique incidence illumination is set for a dark and rectangular area "a" on the effective light-source plane in FIG. 20. The diffracted beams labeled by 10' and 15' respectively move to areas $b_1$ and $b_2$ depicted by diagonals, and enter both ends on the pupil in the projection optical system 400. Two diffracted beams enter the pupil with the effective light source shown by one rectangle, and result in interference, forming interference infringes at a regular interval on the plate 500. Similarly, the oblique incidence illumination may be set even for two diffracted beams 10 and 17 as described for the beams 10 and 15. Four rectangular effective light source areas are combined as shown in FIG. 21, and linear interference infringes with a regular pitch in longitudinal and transverse directions cause part having strong intensity and part having weak intensity to appear two-dimensionally and periodically at intersections of overlapping light intensity on the plate 500. The effective light source at this time has, as shown in FIG. 22A, a crossed four-rectangle shape that extends in a direction orthogonal to the radial direction of the crossed pupil. Illumination of a mask using light from such an effective light source forms crossed oblique incidence illumination.

Figure 23A:
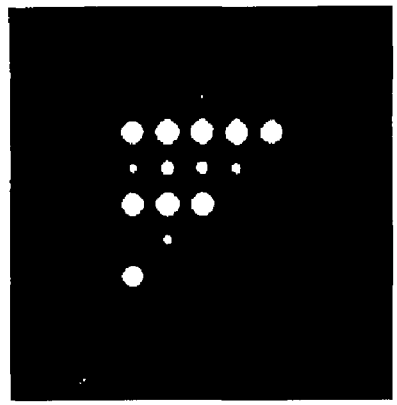
FIG. 23 is a view showing a simulation of a pattern that resolves on a pattern surface.
Figure 23A:
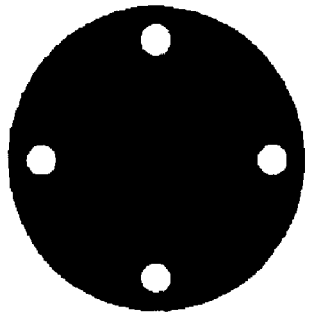
Figure 23B:
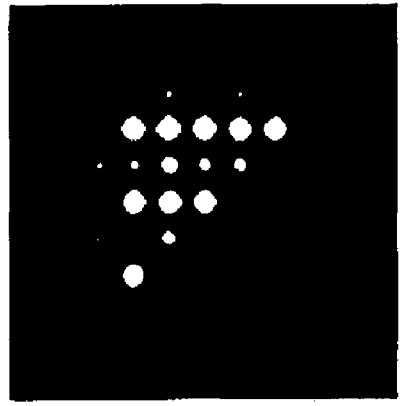
Figure 23B:
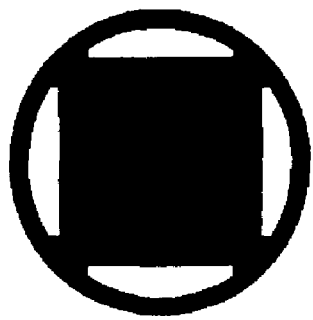

The mask 300a shown in FIG. 18 makes larger a hole diameter size of a desired contact-hole pattern than that of the auxiliary pattern, and thus the part has larger intensity than the peripheral, forming the desired contact-hole pattern on the plate 500. However, mere crossed oblique incidence illumination would create a dummy resolution pattern on the plate 500, as shown in FIGS. 23A and 23B, which is an unnecessary pattern other than the desired contact-hole pattern. Here, FIG. 23 is a view showing a simulation of a resolution pattern on the plate 500 corresponding to a shape of the right effective light source. White part is bright part in FIG. 23.

Figure 24:
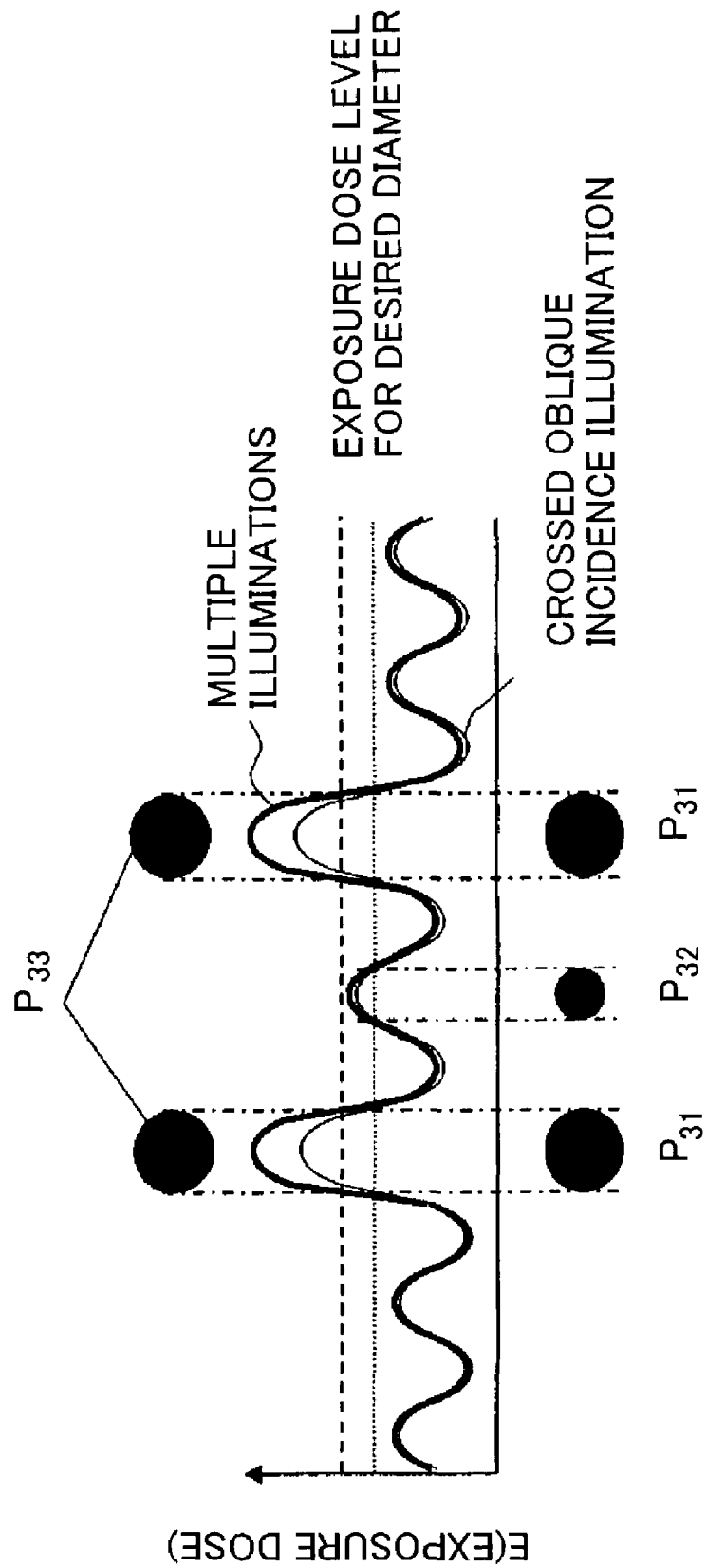
FIG. 24 is a view showing an exposure dose and an image on a pattern corresponding to the exposure dose for crossed oblique illumination and modified illumination of the second variation.

In other words, when the exposure dose is addressed, it becomes like a ray of a thin solid line shown in FIG. 24, and the dummy resolution pattern $P_{32}$ occurs between desired pattern $P_{31}$ in the exposure dose level of the desired diameter (or a threshold of the resist). Here, FIG. 24 is a view showing an exposure dose and an image on the plate 500 corresponding to the exposure dose under crossed oblique illumination and the inventive modified illumination.

Figure 22B:
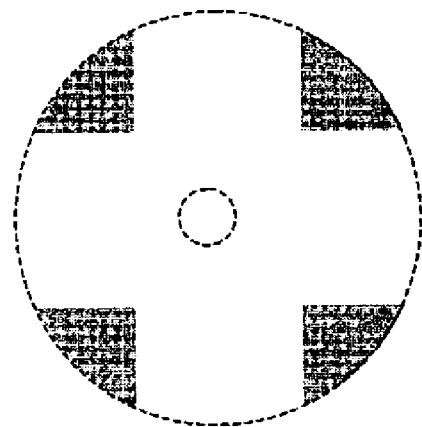
Figure 25:
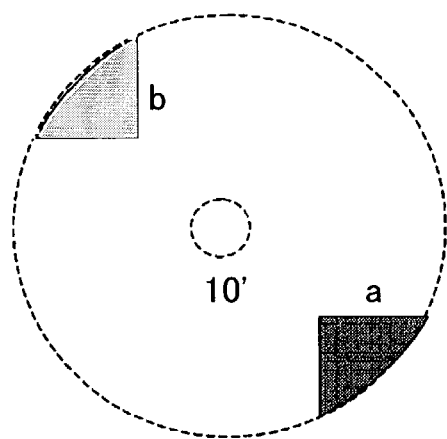
FIG. 25 shows one example of an effective light source distribution.

Accordingly, as shown in FIG. 19, except an area "c" that is defined by linearly connecting positions of two diffracted beams on the pupil plane, an effective light source distribution is added which enables only one diffracted light to enter the pupil plane. In this case, 0-th order beam is suitable for the one diffracted beam, since an oblique incidence angle may be made small. FIG. 25 shows one example of the effective light source distribution. Such illumination is available, for example, by enabling one diffracted beam 10' to enter the dark and sector area "a" in the effective light source plane. Thereby, the diffracted beam labeled by 10' moves to a bright and sector area b, and thus the diffracted light enters the pupil plane 320. There are totally four pieces corresponding to these conditions, resulting in an effective light source as shown in FIG. 22B.

Figure 22C:
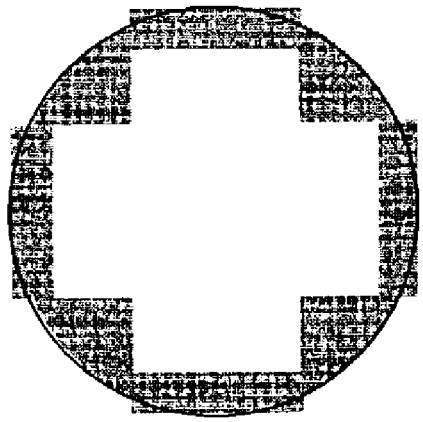
Figure 23C:
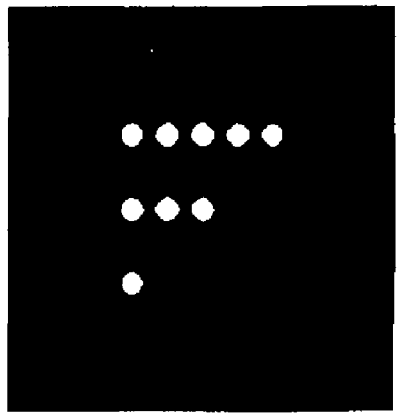
Figure 23C:
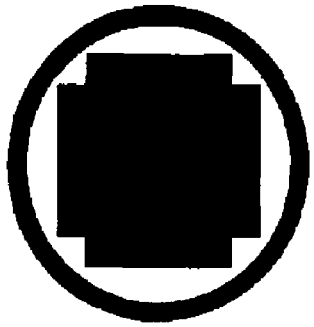

And, an addition of an effective light source distribution that enables two beams to enter the pupil (see FIG. 22A) to an effective light source distribution that enables one beam to enter the pupil (see FIG. 22B) is modified illumination which has a crossed hollow effective light source at its central part, as shown in FIG. 22C. The modified illumination having such an effective light source distribution provides a desired pattern on the plate 500 while the dummy resolution is eliminated as shown in FIG. 23C.

In other words, the exposure dose of the plate 500 is as a ray of a wide solid line shown in FIG. 24, increases the exposure dose at part corresponding to the desired pattern on the mask, and provides a desired pattern $P_{33}$ without a dummy resolution pattern in the exposure dose level of the desired diameter (or a threshold of the resist).

It is thus understood that the effective light-source distribution shown in FIG. 22C improves the resolving power for the contact-hole pattern on the mask 300a shown in FIG. 18.

Figure 26:
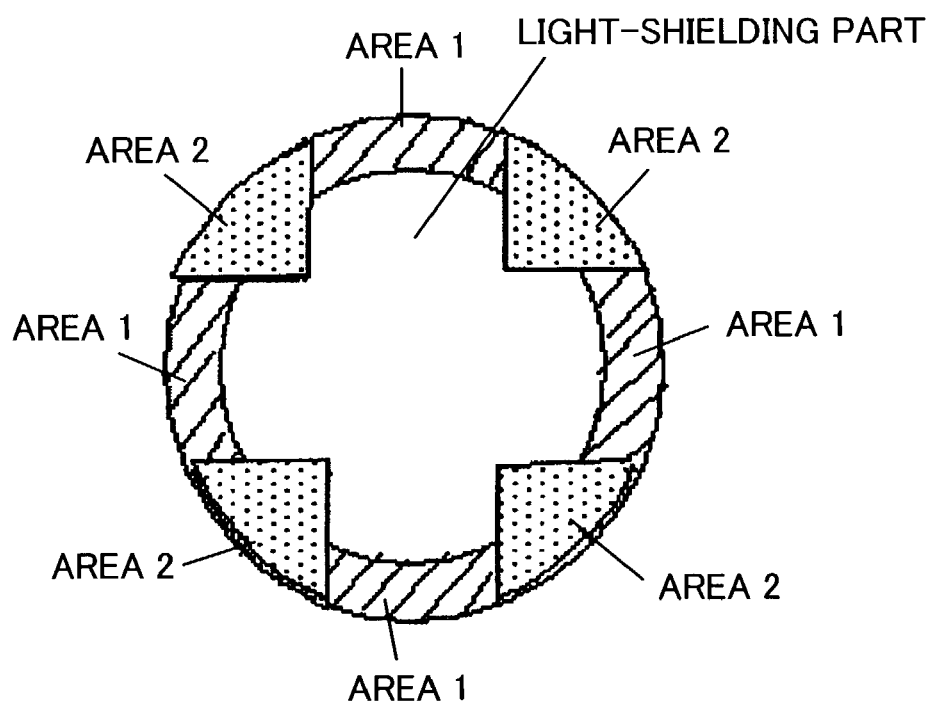
FIG. 26 is a typical view for explaining an effective light-source distribution.

This variation refers to illumination part as area 1 for mainly resolving contact holes, and illumination part as area 2 for mainly restraining the dummy resolution caused by the area 1 or for enhancing contrast between the desired contact-hole pattern and the auxiliary pattern. See FIG. 26.

Figure 12:
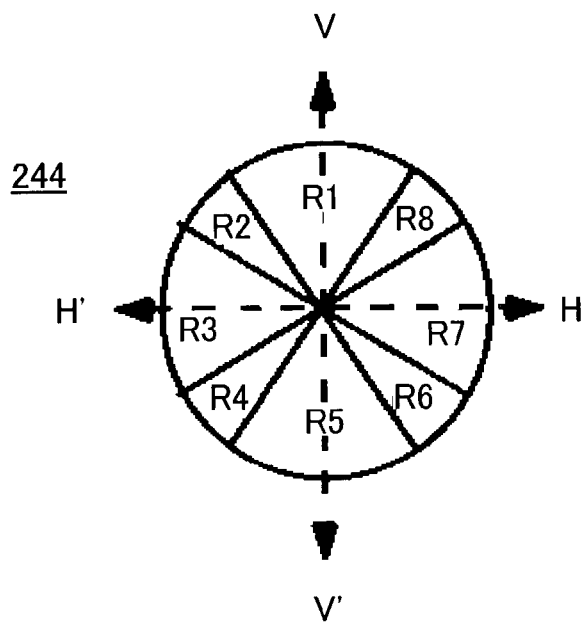
FIG. 12 is a schematic sectional view of an octpole prism, which is not segmented regularly, in a direction perpendicular to the optical axis.
Figure 13:
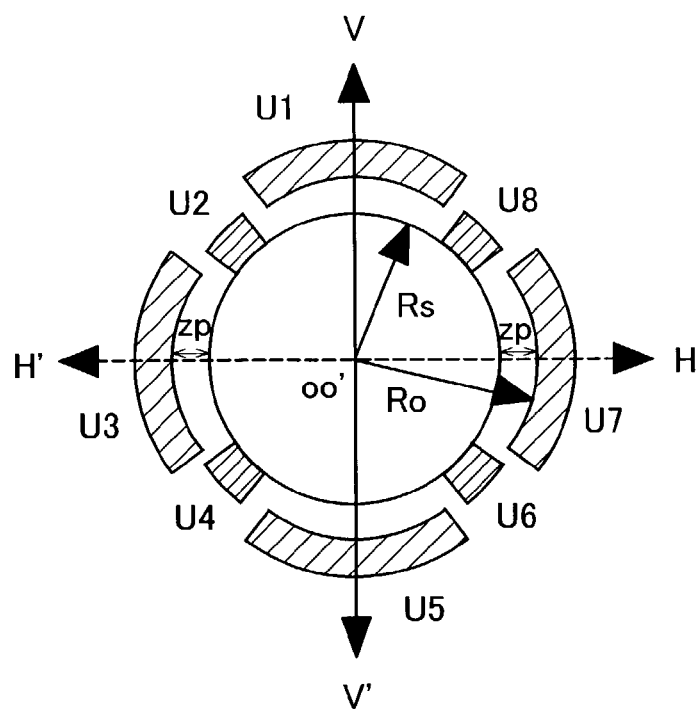
FIG. 13 is a schematic view of an exemplary effective light-source distribution that the octpole prism shown in FIG. 12 forms.

A generation of an effective light-source distribution having these areas 1 and 2 may use the octpole prism 244 that is not regularly segmented into eight parts Q1, Q2, Q3, Q4, Q5, Q6, Q7 and Q8. FIG. 12 is a schematic sectional view of the octpole prism 244, which is not segmented regularly, in a direction perpendicular to the optical axis. Referring to FIG. 12, the octpole prism 244 extends in the longitudinal and transverse areas R1, R3, R5 and R7, and shrinks in the oblique areas R2, R4, R6 and R8. The octpole prism 244 forms an effective light-source distribution shown in FIG. 13. FIG. 13 is a schematic view of an exemplary effective light-source distribution that the octpole prism 244 shown in FIG. 12 forms.

Referring to FIG. 13, areas U1, U2, U3, U4, U5, U6, U7 and U8 (i.e., diagonal parts) are partial effective light sources. The area 1 or the effective light-source areas U1, U3, U5 and U7 determines resolving power of contact holes and are arranged distant from the optical axis on the pupil plane in the projection optical system 400 so as to increase the space coherence σ and its light amount. On the other hand, the oblique areas 2 or the effective light-source areas U2, U4, U6 and U8 are effective restraint to the dummy resolution so as to enhance the contrast between the desired contact-hole pattern and auxiliary pattern. These areas 2 are arranged close to the optical axis on the pupil plane in-the projection optical system 400 so as to decrease the space coherence σ and its light amount.

When a zooming means (not shown) similar to the above zooming means 246 is adapted to displace the effective light-source distribution area 1, i.e., longitudinal and transverse areas U1, U3, U5 and U7 in this variation shown in FIG. 13, the area 1 may be displace relative to the area 2, i.e., oblique areas U2, U4, U6 and U8 in this variation. This configuration may optimize the illumination condition instantly even when the size and arrangement of the desired pattern and/or auxiliary pattern on the mask change. In other words, the effect of the auxiliary pattern is enhanced to resolve the contact-hole pattern by changing relative positions between the areas 1 and 2 the according to the contact-hole pattern to be formed. This illumination condition is optimized by previously inputting in a memory (not shown) in the exposure apparatus information on a reticle pattern to be exposed, and obtaining the pattern information before the exposure, or by previously providing an ID mark, such as a barcode onto a reticle, and detecting the mark before the exposure to obtain the pattern information.

Although this variation displaces the area 1 as the effective light-source distribution, the area 2 or both may be made displaceable.

Figure 14:
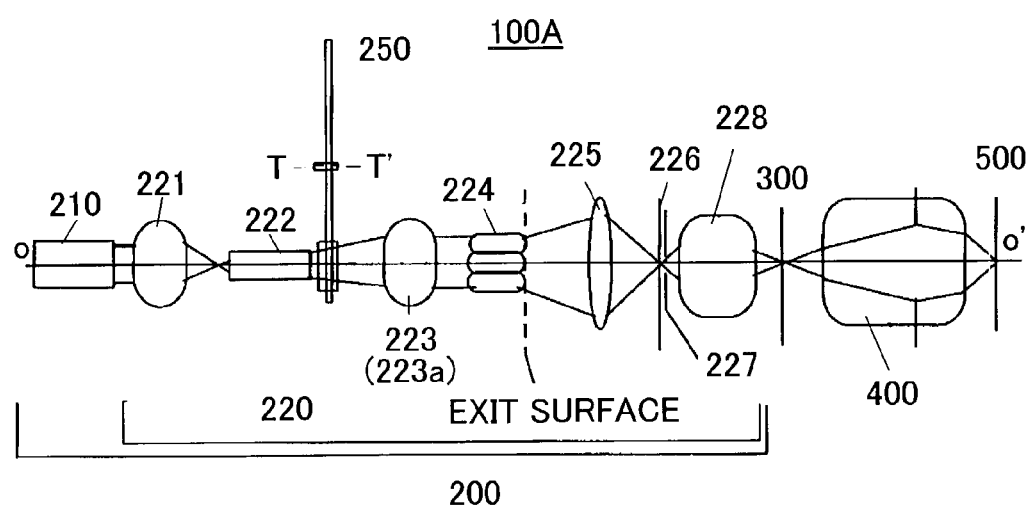
FIG. 14 is a schematic structural view of an exposure apparatus including an effective light-source generating means as a variation of an effective light-source generating means shown in FIG. 1.
Figure 15:
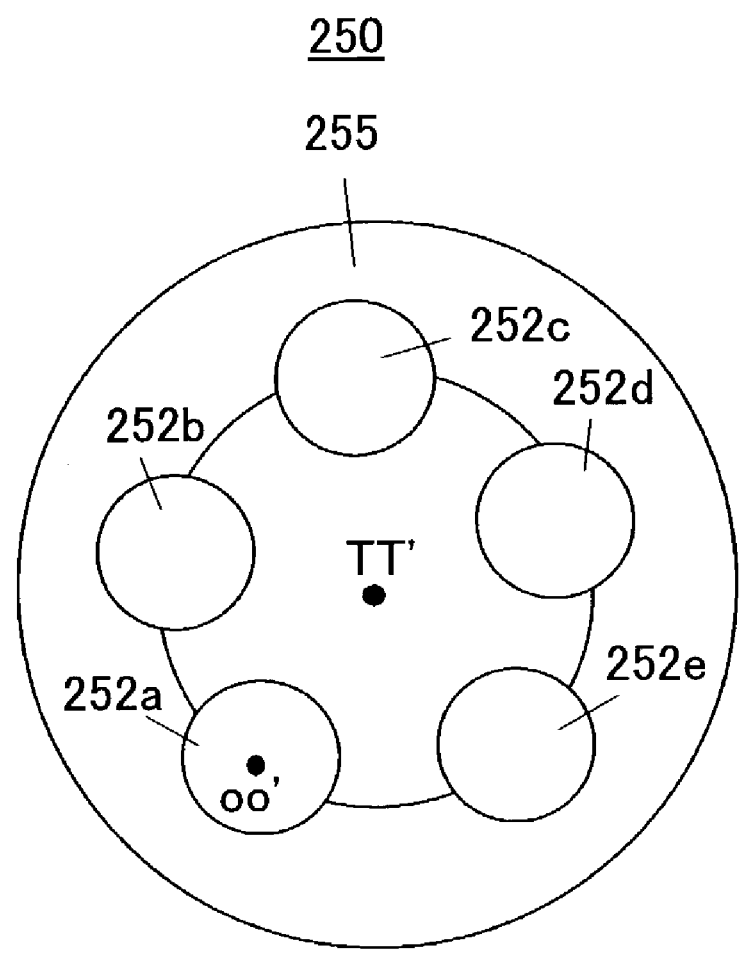
FIG. 15 is a schematic plane view of an exemplary effective light-source generating means.

Referring now to FIGS. 14 and 15, a description will be given of illumination-light generating means 250 as a third variation of the illumination-light generating means 240. FIG. 14 is a schematic structural view of an exposure apparatus 100A including an effective light-source generating means 250 as a third variation of an effective light-source generating means 240. The effective light-source generating means 250 is different from the effective light-source generating means 140 in that the effective light-source generating means 250 uses a switching means 255 to switch plural modified-illumination generating elements 252*a* to 252*e*. FIG. 15 is a schematic plane view of one example of the effective light-source generating means 250 including a switching means shown in FIG. 14.

The switching means 255 has a turret shape and arranges plural modified-illumination generating elements 252*a* to 252*e* around its rotational center TT'. The modified-illumination generating elements 252*a* to 252*e* may be a binary optics ("BO") or manufactured using technology of computer generated hologram ("CGH"). Alternatively, one of the modified-illumination generating elements 252*a* to 252*e* may use the partial zooming means (not shown) similar to the above partial zooming means 246 to displace part of the partial effective light sources. For example, the modified-illumination generating element 252*a* is a quadrupole generating element having a partial zooming means (not shown), and the modified-illumination generating element 252*b* is an octpole generating element having a partial zooming means (not shown). Although each element does not have a partial zooming means and its effective light-source distribution is fixed, switches among them provide the turret with the partial zooming function.

As the illumination optical system 220 includes the first zoom condenser lens 223 having a zooming function in the above configuration, a size or σ value is made variable while maintaining a ratio of a distance of each effective light-source area from the optical axis (e.g., Rs and Ro in FIG. 13). When the modified-illumination generating element 252 uses a diffraction optical element, the first zoom condenser lens 223 is replaced with a first zoom condenser lens 223*a* that provides an exit surface of the uniformization element 222 and an incidence surface of the integrator 224 with a Fourier conversion relationship with each other. The Fourier conversion relationship in this specification refers to an optical relationship between a pupil plane and an object plane (or image plane) or vice versa.

The above embodiments always displace the partial effective light sources symmetrical to the optical axis of the illumination. For example, the effective light source partially displaces symmetrical to a line V–V' perpendicular to the optical axis O–O' in FIG. 8, while the effective light source partially displaces symmetrically around the optical axis in FIG. 11. Thereby, the partial effective light source does not move its optical center of gravity before and after the displacement, and thus telecentricity. As shown in FIG. 8, when the effective light source partially displaces symmetrical to the line V–V' perpendicular to the optical axis O–O', the telecentricity maintains at least in a direction H–H' perpendicular to the line V–V'.

The present invention allows the partial effective light source to displace asymmetrical to the optical axis. For example, the area S2 may displace in the direction H–H' in the effective light source shown in FIG. 8. This works when the zooming means affects the area P2 on the quadrupole 242. Ideally, the partial effective light sources S1 to S4 have a uniform light intensity distribution, but they have a non-uniform one actually due to various manufacture errors. Even when they have the same apparent distance Rh from the optical axis, the areas S2 and S4 have different light amount moments that are produced by multiplying the distance by the light intensity distribution. In such a case, when the area S2 displaces in the direction H–H', they have the same light amount moment and maintain the telecentricity satisfactorily.

Turning back to FIG. 1 again, the mask 300 is made, for example, of quartz, which forms a circuit pattern or an image to be transferred, and is supported and driven by a mask stage (not shown). Diffracted light through the mask 300 is projected onto the plate 500 through the projection optical system 400. The mask 300 and plate 500 are arranged in a conjugate relationship. Since the exposure apparatus 100 according this embodiment is a scanner, it transfers a mask pattern onto the plate 500 by scanning the mask 300 and plate 500.

The projection optical system 400 forms an image onto an image plane, e.g., an object to be exposed or the plate 500 using light from an object plane, i.e., the mask 300. The projection optical system 400 includes a stop surface (not shown), and controls NA by opening and closing the stop surface. The stop surface, has an optically conjugate relationship with an exit surface of the integrator 224. The projection optical system 400 may use an optical system solely composed of a plurality of lens elements, a catadioptric optical system comprised of a plurality of lens elements and at least one concave mirror, an optical system comprised of a plurality of lens elements and at least one diffractive optical element such as a kinoform, and a catoptric optical system including only mirrors, and so on. Any necessary correction of chromatic aberration may use a plurality of lens units made from glass materials having different dispersion values (Abbe values), or arrange a diffractive optical element such that it disperses in a direction opposite to that of the lens unit.

The plate 500 is a wafer in the instant embodiment, but it may include a liquid crystal plate and a wide range of other objects to be exposed. Photoresist is applied onto the plate 500. A photoresist application step includes a pretreatment, an adhesion accelerator application treatment, a photo-resist application treatment, and a pre-bake treatment. The pretreatment includes cleaning, drying, etc. The adhesion accelerator application treatment is a surface reforming process so as to enhance the adhesion between the photo resist and a base (i.e., a process to increase the hydrophobicity by applying a surface active agent), through a coat or vaporous process using an organic film such as HMDS (Hexamethyldisilazane). The pre-bake treatment is a baking (or burning) step, softer than that after development, which removes the solvent.

The plate 500 is supported by the plate stage (not shown). The plate stage may use any structure known in the art, and thus a detailed description of its structure and operations is omitted. For example, the plate stage uses a linear motor to move the plate 500 in X-Y directions. The mask 300 and plate 500 are, for example, scanned synchronously, and the positions of the mask stage and plate stage (not shown) are monitored, for example, by a laser interferometer and the like, so that both are driven at a constant speed ratio. The plate stage is installed on a stage barrel stool supported on the floor and the like, for example, via a dumper, while the mask stage and the projection optical system 400 are installed on a stage barrel stool (not shown) supported by the base frame placed on the floor, for example, via a dumper.

In exposure, light emitted from the light source section 210 illuminates the mask 300 through the illumination optical system 220. The light that has passed and indicates the mask pattern forms an image on the plate 500 through the projection optical system 400.

The illumination optical system 200 used for the exposure apparatus 100 illuminates the mask 300 with an optimal illumination condition according to the desired pattern formed on the mask 300, providing devices (such as semiconductor devices, LCD devices, image pick-up devices (such as CCDs), thin film magnetic heads, and the like) with high resolution, throughput and economical efficiency.

Figure 16:
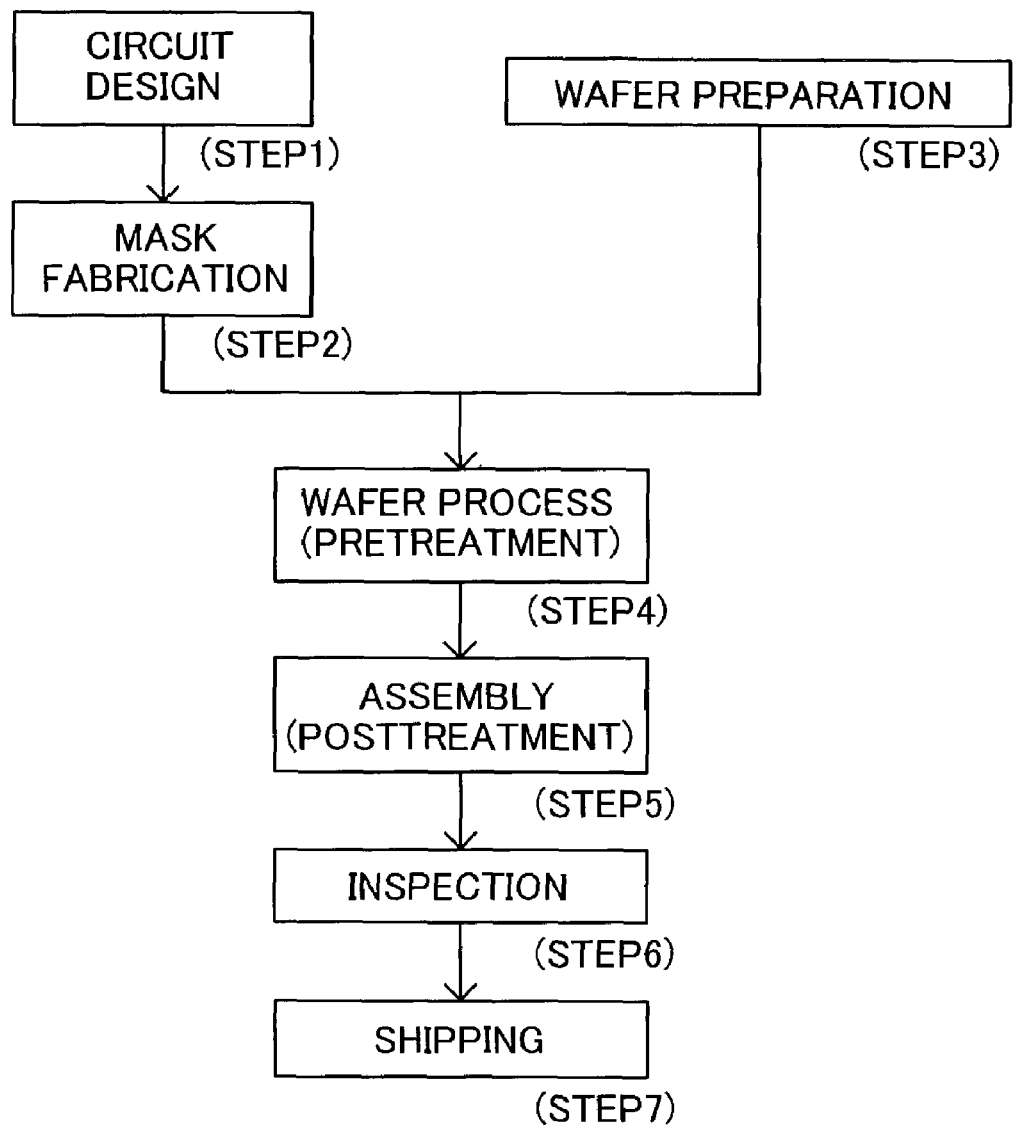
FIG. 16 is a flowchart for explaining a device fabricating method that includes the exposure steps of the present invention.
Figure 17:
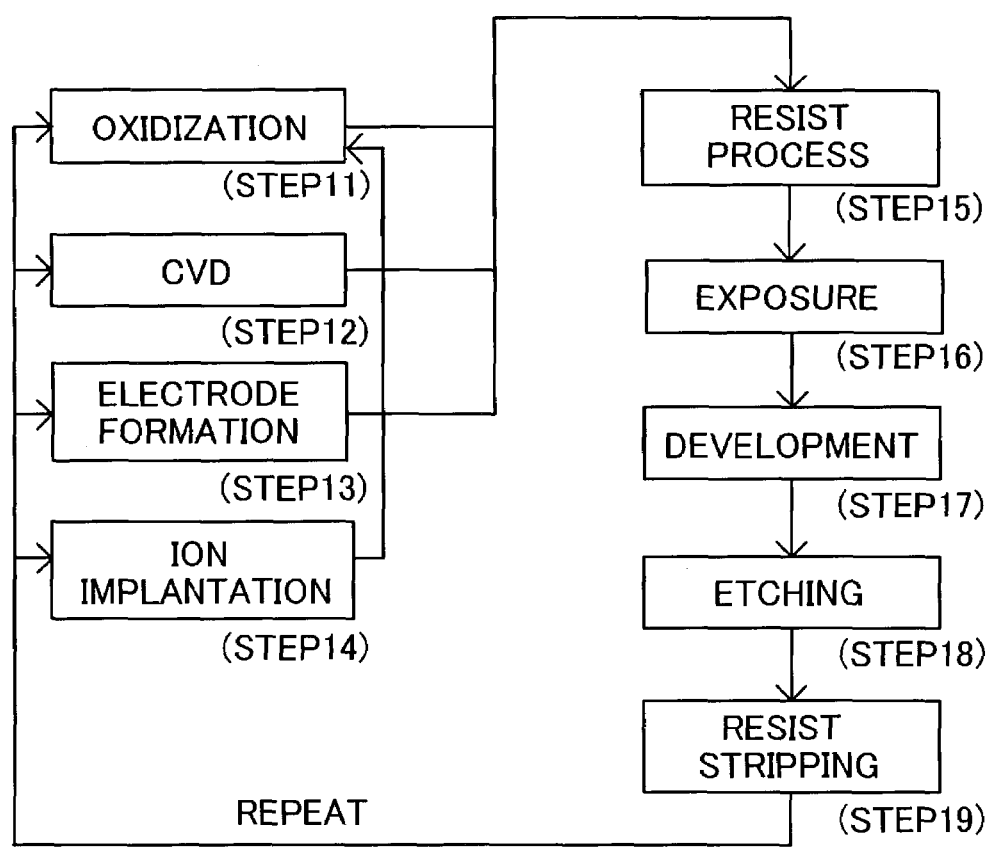
FIG. 17 is a flowchart for Step 4 shown in FIG. 16.

Referring now to FIGS. 16 and 17, a description will be given of an embodiment of a device fabricating method using the above exposure apparatus 100. FIG. 12 is a flowchart for explaining a fabrication of devices (i.e., semiconductor chips such as IC and LSI, LCDs, CCDs, etc.). Here, a description will be given of a fabrication of a semiconductor chip as an example. Step 1 (circuit design) designs a semiconductor device circuit. Step 2 (mask fabrication) forms a mask having a designed circuit pattern. Step 3 (wafer preparation) manufactures a wafer using materials such as silicon. Step 4 (wafer process), which is referred to as a pretreatment, forms actual circuitry on the wafer through photolithography using the mask and wafer. Step 5 (assembly), which is also referred to as a posttreatment, forms into a semiconductor chip the wafer formed in Step 4 and includes an assembly step (e.g., dicing, bonding), a packaging step (chip sealing), and the like. Step 6 (inspection) performs various tests for the semiconductor device made in Step 5, such as a validity test and a durability test. Through these steps, a semiconductor device is finished and shipped (Step 7).

FIG. 17 is a detailed flowchart of the wafer process in Step 4. Step 11 (oxidation) oxidizes the wafer's surface. Step 12 (CVD) forms an insulating film on the wafer's surface. Step 13 (electrode formation) forms electrodes on the wafer by vapor disposition and the like. Step 14 (ion implantation) implants ion into the wafer. Step 15 (resist process) applies a photosensitive material onto the wafer. Step 16 (exposure) uses the exposure apparatus 200 to expose a circuit pattern on the mask onto the wafer. Step 17 (development) develops the exposed wafer. Step 18 (etching) etches parts other than a developed resist image. Step 19 (resist stripping) removes disused resist after etching. These steps are repeated, and multilayer circuit patterns are formed on the wafer. The device fabrication method of this embodiment may manufacture higher quality devices than the conventional one.

Further, the present invention is not limited to these preferred embodiments, and various variations and modifications may be made without departing from the scope of the present invention.

The inventive illumination optical system thus provides an optimal illumination condition to a circuit pattern on a mask.

What is claimed is:

1. An illumination optical system for illuminating a reticle using light from a light source, said illumination optical system comprising an illumination-light generating mechanism for relatively displacing a first area and a second area different from the first area, the first and second areas being a light amount distribution formed on a plane that has a substantially Fourier conversion relationship with the reticle,
   wherein light from the first area illuminates the reticle to resolve a desired pattern on the reticle, and light form the second area illuminates the reticle to restrain an auxiliary pattern on the reticle from resolving.

2. An illumination optical system according to claim 1, wherein at least one of the first and second areas has plural areas that are symmetrically movable relative to an optical axis.

3. An illumination optical system according to claim 1, wherein at least one of the first and second areas has plural areas that are movable relative to an optical axis.

4. An illumination optical system according to claim 1, wherein the effective light-source generating mechanism is a light deflection member including a prism or diffraction optical element.

5. An illumination optical system for illuminating a reticle using light from a light source, said illumination optical system comprising:
  a first member for forming a first area in a light amount distribution on a plane that has a substantially Fourier conversion relationship with the reticle;
  a second member for forming a second area different from the first area on the plane; and
  a drive mechanism for relatively displacing the first and second areas by moving at least one of the first and second members in an optical-axis direction,
  wherein light from the first area illuminates the reticle to resolve a desired pattern on the reticle, and light from the second area illuminates the reticle to restrain an auxiliary pattern on the reticle from resolving.

6. An illumination optical system according to claim 5, wherein at least one of the first and second areas has plural areas symmetrically movable relative to an optical axis.

7. An illumination optical system according to claim 5, wherein at least one of the first and second areas has plural areas asymmetrically movable relative to an optical axis.

8. An illumination optical system according to claim 5, wherein the first and second members are respectively a light deflection member including a prism.

9. An exposure method comprising the step of illuminating a reticle using an illumination optical system with light from a light source,
  wherein the illumination optical system includes an illumination-light generating mechanism for displacing a first area and a second area different from the first area, the first and second areas being a light amount distribution formed on a plane that has a substantially Fourier conversion relationship with the reticle, and
  wherein light from the first area illuminates the reticle to resolve a desired pattern on the reticle, and light from the second area illuminates the reticle to restrain an auxiliary pattern on the reticle from resolving.

10. An exposure method comprising the step of illuminating a reticle using an illumination optical system with light from a light source,
  wherein the illumination optical system includes a first member for forming a first area in a light amount distribution on a plane that has a substantially Fourier conversion relationship with the reticle, a second member for forming a second area different from the first area on the plane, and a drive mechanism for displacing the first and second areas by moving at least one of the first and second members in an optical-axis direction, and
  wherein light from the first area illuminates the reticle to resolve a desired pattern on the reticle, and light from the second area illuminates the reticle to restrain an auxiliary pattern on the reticle from resolving.

11. An illumination method for illuminating a reticle having a pattern using light from a light source, said illumination method comprising the steps of:
  obtaining information of the pattern; and
  displacing first and second effective light-source areas relative to each other based on the information of the pattern obtained in said obtaining step, the first effective light-source area being for resolving the pattern, and the second effective light-source area, different from the first effective light-source area, being for restraining an auxiliary pattern on the reticle from resolving,
  wherein the pattern includes a desired pattern and an auxiliary pattern.

12. An exposure method for illuminating a reticle and exposing an object using light from the reticle, said method comprising the steps of:
  obtaining information of a pattern formed on the reticle; and
  displacing first and second effective light-source areas relative to each other based on the information of the pattern obtained in said obtaining step, the first effective light-source area being for resolving the pattern, and the second effective light-source area, different from the first effective light-source area, being for restraining an auxiliary pattern on the recticle from resolving,
  wherein the pattern includes a desired pattern and an auxiliary pattern.

13. An exposure apparatus comprising:
  an illumination optical system for illuminating a reticle using light from a light source, said illumination optical system including an illumination-light generating mechanism for displacing a first area and a second area different from the first area, the first and second areas being a light amount distribution formed on a plane that has a substantially Fourier conversion relationship with the reticle, wherein light from the first area illuminates the reticle to resolve a desired pattern on the reticle, and light from the second area illuminates the reticle to restrain an auxiliary pattern on the reticle from resolving; and
  a projection optical system for projecting light from the reticle onto an object to be exposed.

14. An exposure apparatus comprising:
  an illumination optical system for illuminating a reticle using light from a light source, said illumination optical system including a first member for forming a first area in a light amount distribution on a plane that has a substantially Fourier conversion relationship with the reticle, a second member for forming a second area different from the first area on the plane, and a drive mechanism for displacing the first and second areas by moving at least one of the first and second members in an optical-axis direction, wherein light from the first area illuminates the reticle to resolve a desired pattern on the reticle, and light from the second area illuminates the reticle to restrain an auxiliary pattern on the reticle from resolving; and
  a projection optical system for projecting light from the reticle onto an object to be exposed.

15. A device fabricating method comprising the steps of:
  exposing an object using an exposure apparatus; and
  performing a predetermined process for the object that has been exposed,
  wherein the exposure apparatus includes:
  an illumination optical system for illuminating a reticle using light from a light source, said illumination optical system including an illumination-light generating mechanism for displacing a first area and a second area different from the first area, the first and second areas being a light amount distribution formed on a plane that has a substantially Fourier conversion relationship with the reticle, wherein light from the first area illuminates the reticle to resolve a desired pattern on the reticle, and light from the second area illuminates the reticle to restrain an auxiliary pattern on the reticle from resolving; and
  a projection optical system for projecting light from the reticle onto an object to be exposed.

16. A device fabricating method comprising the steps of:
exposing an object using an exposure apparatus; and
performing a predetermined process for the object that has been exposed,
wherein the exposure apparatus includes: an illumination optical system for illuminating a reticle using light from a light source, said illumination optical system including a first member for forming a first area in a light amount distribution on a plane that has a substantially Fourier conversion relationship with the reticle, a second member for forming a second area different from the first area on the plane, and a drive mechanism for displacing the first and second areas by moving at least one of the first and second members in an optical-axis direction, wherein light from the first area illuminates the reticle to resolve a desired pattern on the reticle, and light from the second area illuminates the reticle to restrain an auxiliary pattern on the reticle from resolving; and a projection optical system for projecting light from the reticle onto an object to be exposed.

* * * * *